(12) United States Patent
James

(10) Patent No.: US 6,653,846 B2
(45) Date of Patent: Nov. 25, 2003

(54) MULTIFUNCTION CIRCUIT CONTINUITY AND SENSOR TESTER

(75) Inventor: Rolland T. James, Collingswood, NJ (US)

(73) Assignee: Eaton Corporation, Cleveland, OH (US)

(*) Notice: Subject to any disclaimer, the term of this patent is extended or adjusted under 35 U.S.C. 154(b) by 91 days.

(21) Appl. No.: 09/952,345

(22) Filed: Sep. 14, 2001

(65) Prior Publication Data

US 2003/0052697 A1 Mar. 20, 2003

(51) Int. Cl.$^7$ .................. H01H 31/02; G01R 27/08; G08B 21/00
(52) U.S. Cl. ................. 324/555; 324/698; 340/635
(58) Field of Search ................. 324/555, 698, 324/511, 503, 556; 340/635, 652, 945

(56) References Cited

U.S. PATENT DOCUMENTS

| | | |
|---|---|---|
| 838,823 A | 12/1906 | Thomson |
| 2,782,401 A | 2/1957 | Boddy |
| 2,845,614 A | 7/1958 | Bell |
| 2,928,037 A | 3/1960 | Lawrence |
| 3,059,443 A | 10/1962 | Garner |
| 3,149,319 A | 9/1964 | Messmer et al. |
| 3,155,956 A | 11/1964 | Hornbostel, Jr. et al. |
| 3,246,517 A | 4/1966 | Malkiewicz |
| 3,251,654 A | 5/1966 | Palmer |
| 3,335,334 A | 8/1967 | Albisser |
| 3,350,710 A | 10/1967 | Bridges |
| 3,461,446 A | 8/1969 | Sergeant |
| 3,498,131 A | 3/1970 | Rickey |
| 3,588,891 A | 6/1971 | Porter |
| 3,601,655 A | 8/1971 | Andersen |
| 3,626,400 A | 12/1971 | Bates |
| 3,766,537 A | 10/1973 | MacFarlane |
| 3,882,476 A | 5/1975 | Lofgren |
| 3,887,824 A | 6/1975 | Blauert et al. |
| 3,928,846 A | 12/1975 | Arai et al. |
| 3,955,183 A | 5/1976 | McBrian |
| 3,963,981 A | 6/1976 | Vis |
| 3,978,477 A | 8/1976 | Schmitz |
| 4,086,570 A | 4/1978 | Wakasa et al. |
| 4,100,491 A | * 7/1978 | Newman et al. ............ 324/446 |
| 4,127,808 A | * 11/1978 | Sproul et al. ............... 324/698 |
| 4,150,369 A | 4/1979 | Gaspari et al. |
| 4,166,243 A | 8/1979 | West et al. |
| 4,176,350 A | 11/1979 | Patterson |
| 4,219,805 A | 8/1980 | Magee et al. |
| 4,236,146 A | 11/1980 | Clark et al. |
| 4,243,971 A | 1/1981 | Suchowerskyj et al. |
| 4,302,754 A | 11/1981 | Magee et al. |
| 4,354,180 A | 10/1982 | Harding |
| 4,498,074 A | 2/1985 | Sasaki |
| 4,504,789 A | 3/1985 | Carr et al. |
| 4,517,161 A | 5/1985 | Cravina et al. |
| 4,544,910 A | 10/1985 | Hoberman |
| 4,667,187 A | 5/1987 | Volk et al. |
| 4,799,019 A | 1/1989 | Cooley et al. |
| 4,831,362 A | 5/1989 | Tsaprazis |
| 5,045,840 A | * 9/1991 | Berrier et al. .............. 340/652 |
| 5,294,909 A | 3/1994 | Frazier |
| 5,610,341 A | * 3/1997 | Tortora ........................ 73/756 |
| 5,907,278 A | * 5/1999 | Park et al. .............. 340/450.3 |
| 2003/0020620 A1 | * 1/2003 | Owen ...................... 340/635 |

FOREIGN PATENT DOCUMENTS

FR 1.389.869 7/1965

OTHER PUBLICATIONS

Encyclopedia of Electronic Circuits vol. 1 by Rudolf F. Graf, © 1985, pp. 3, 97, 299, 303, 515 and 596.

* cited by examiner

*Primary Examiner*—Anjan K. Deb
(74) *Attorney, Agent, or Firm*—Robert S. Lipton, Esq.; Lipton, Weinberger & Husick

(57) ABSTRACT

A primary, normally open, DC monitoring circuit with a circuit continuity test device is disclosed which will also test one or more additional sensors connected to the circuit. The sensing of lack of continuity or of a fault condition detected by an additional sensor governs the status of a single indicator, generally a warning light.

21 Claims, 7 Drawing Sheets

MULTIFUNCTION CIRCUIT CONTINUITY AND SENSOR TESTER

FIELD OF THE INVENTION

The present invention relates generally to direct current electrical circuits and warning systems for such circuits which indicate that the circuit is operating properly by actuating an indicator, generally a light, for a predetermined period of time commencing upon the supply of power to the circuit.

BACKGROUND OF THE INVENTION

Monitoring systems are well known which indicate that an electrical circuit connected to a sensor or device being monitored and which is connected to the circuit are operating properly by turning on or actuating an indicator. The most common type of indicator is a light. Such systems are commonly in use in the electrical systems for machinery, power systems and motor vehicles.

Aircraft are a category of vehicles in which such monitoring systems are widely used. Aircraft systems of all types, including monitoring systems, are designed to minimize weight and energy usage. For example, electrical circuits in aircraft frequently use the body of the aircraft as one of the two electrical conductors necessary for completion of an electric circuit. In this case, the aircraft body is referred to as "ground." In some aircraft, particularly those having a body which is made of a material which is not a conductor of electricity, an electrical conductor is used as ground. In either case, the non-ground conductor is a wire or cable which, is generally connected to the positive terminal of the direct current ("DC") power supply. The other, negative, terminal of the power supply is connected to the ground. Any electrical device or sub-circuit must be connected to both the positive terminal or to a conductor that is, and to ground.

Aircraft monitoring systems frequently use an indicator such as a light, frequently referred to in the industry as a lamp, and a sensor of some type which is normally open. When the adverse condition which is being monitored occurs, the open sensor closes completing the circuit and the light is turned on. For example, this is what happens when the fuel in most automobiles drops below a predetermined level.

Some items being monitored are sufficiently important that the electrical continuity of the electrical conductor(s), connecting the sensor to the power supply, is checked every time the power to the circuit is turned on. The lack of continuity indicates that the sensor and anything else connected to the circuit, will not operate. The lack of continuity is generally due to a broken or disconnected electrical conductor. The checking or testing of circuit continuity requires that the circuit temporarily be closed or "shorted" at or as close as possible to the monitoring sensor. If upon the closing of the circuit, the indicator is actuated, the circuit has electrical continuity, or if there is no indication then there is a problem as continuity has been lost. The testing of circuit continuity in this manner simulates the sensor having detected the adverse condition which it was designed to detect. The testing of the circuit by the closing or shorting of a monitoring circuit is commonly accomplished automatically by test devices, such as a test circuit connected to the monitoring circuit.

In order to perform its task the test circuit must have electrical power. This may be accomplished by connecting the test circuit to the power supply by its own circuit, i.e., its own conductor and ground. This would result in an additional conductor being used. The use of an additional conductor can be avoided by connecting the test circuit to the monitoring circuit itself, i.e., by connecting the test circuit in parallel with the monitoring circuit. The present invention relates to test circuits of the type where the test circuit is connected to the same conductor and ground as the monitoring circuit thereby causing the monitoring circuit to supply power to both the sensor and to the test circuit.

The condition of aircraft engine lubricating oil is one of many conditions which are commonly monitored in aircraft. Chip detectors are placed in the oil lubrication system which detect the presence of electrically conductive metallic particles above a certain size, or an amount of particles, greater than the amount of particles which always occur due to normal wear during use and which are referred to as "wear particles". The occurrence of such large particles or an accumulation of larger than normal particles is an indication that a possible dangerous failure of some type may occur. If that condition occurs, an indicator is actuated in the aircraft cockpit alerting the aircraft crew that there is a problem. The chip detector includes two electrically conductive members having a gap between them. Normally the gap is not filled or closed thus forming an open electrical circuit. When the gap is filled as a result of the adverse condition, i.e., one or more electrically sufficiently large conductive chips bridge the gap and close the circuit. Chip detectors may, in some cases, be placed in an aircraft lubricating system where the oil level is adequate for lubricating an engine or transmission but the level is not sufficient at the chip detector location for the chip detector gap to be immersed in the oil and, thus, being incapable of detecting a chip. It is for this reason that an oil level sensor may be placed at an appropriate location proximate to the chip detector so that indication will be given if the oil is below a predetermined level which would result in the chip detector being inoperable. It must be emphasized that this oil level sensor is separate and distinct from the engine oil level sensor which detects whether or not the oil level has dropped below a level which is acceptable for lubrication.

The present invention may also be used to provide an indication that there is an acceptable oil level for lubrication systems for other remotely located devices such as a gearbox.

In order for the chip detector to be operable, not only must the monitoring circuit have continuity but the oil level at the chip detector must be adequate.

In some cases, it is not necessary to measure sensor oil level as the sensor is located in the aircraft lubrication system at a point where it is always immersed in oil when the oil level is adequate for engine lubrication.

The present invention is being described using a sensor which detects metallic chips which are electrically conductive by way of example only. As will readily be understood by those skilled in the art, the present invention is applicable to any sensor, or similar device, which completes a DC circuit when the condition being monitored occurs, or which can be adapted to complete such a circuit.

SUMMARY OF THE INVENTION

In order to save weight or to retrofit existing aircraft with chip detector oil level sensors, such sensors may be connected in parallel with the chip detector monitoring circuit. The present invention is a test circuit which will, upon the turning on of the power to an aircraft electrical system, both provide an indication of monitoring circuit continuity and adequate oil level at the chip detector as determined by a chip detector oil level sensor.

In prior art, test circuits for chip detector monitoring circuits, the test circuit shorts or closes the circuit at a location adjacent to the chip detector for an arbitrary time period, as it does for all other circuits which are being tested at the same time. Although the time period is arbitrary in at least one prior art application it is fifty seconds which shall be used for purposes of describing the present invention. Thus, for a period of fifty seconds, beginning at power up, an array of warning lights will illuminate during the fifty-second time period. The aircraft crew scans the instrument panel looking for lights which fail to illuminate thus indicating a problem with the particular circuit associated with that light. There may be a separate system which tests the warning lights or other illuminating devices to ensure that they are operating properly. After the fifty-second time period the test is completed by removing the short resulting in lights to being extinguished.

After the test, the actuation of a warning light indicates that that particular monitoring circuit detected a fault, e.g., it would indicate that the chip detector monitoring circuit has detected a chip or an accumulation of chips of excessive size and that the aircraft crew should take appropriate action. The test circuit of the present invention will, during a test at start up, provide an indication of one or both of the following conditions by causing a single light to indicate if there is: (1) lack of electrical continuity of the chip detector monitoring circuit or (2) inadequate oil level at the chip detector.

If there is no continuity between the lamp and the chip detector and continuity testing circuit, the panel lamp will not illuminate upon aircraft power-up or after the 50 second test period. The lack of a lit lamp will alert the pilots to a problem. If there is continuity in the circuit, aircraft manufacturers have chosen two alternative methods to indicate to the pilots that there is a problem with chip detector oil level. In a first manner, the panel lamp will illuminate during the test period to indicate continuity, but will remain on after the test period to indicate a problem with the oil level. The illumination of the lamp during the test period and it not being illuminated after the end of the test period indicates that the circuit has continuity and that the oil level at the detector is adequate. In the second manner which may be chosen by some aircraft manufacturers, low oil level at the chip detector will prevent the panel lamp from illuminating at all even during the test period. This manner does not distinguish between a lack of continuity and a low oil level but does alert the pilots that there is a problem.

The present invention could be adapted so that a problem is indicated by having the light illuminated and that the lack of a problem is indicated by the light not being illuminated. Use of this mode would require that the continuity test be made after a test confirming the operability of the lights or lamps. Which of the two indicating modes is a matter of choice.

In a first embodiment of the invention, the first manner discussed above of indicating low oil level is implemented. In a second embodiment of the invention, the second manner discussed above of indicating low oil level is implemented.

DETAILED DESCRIPTION OF THE EMBODIMENTS OF THE INVENTION

At power-up, a lack of continuity of the sensor circuit will always be indicated by the failure of the associated panel lamp to light either during the test period or after the expiration of the test period. Provided there is continuity, the presence of chips across the terminals in the chip detector will cause the panel lamp to illuminate during and stay illuminated after the test period. If there is continuity and no chips have closed the circuit in the chip detector, there are two different ways which may be employed in aircraft to indicate to the pilot that there is insufficient oil at the chip sensor. In the first way, the panel lamp will illuminate during the test period to indicate continuity but will stay illuminated after the test period to indicate a fault. In the second way, the panel light is never illuminated either during the test period or after the test period is over. The display method which is used is determined by the aircraft manufacturer and pilots are trained accordingly. The multifunction testing circuit of the present invention may be implemented in either of two embodiments to provide for both of the two ways of indicating too low an oil level. The following table sets forth the illumination status of the panel lamp corresponding to the continuity status and the status of the chip and oil sensors.

|  | Continuity | No Continuity | Oil | No Oil | Chips | No Chips | Display During Cont. Test | Display After Cont. Test |
|---|---|---|---|---|---|---|---|---|
| Cockpit Display |  | X | — | — | — | — | OFF | OFF |
|  | X |  | — | — | X |  | ON | ON |
| Alternative 1 | X |  |  | X |  | X | ON | OFF |
|  | X |  |  | X | X |  | ON | ON |
| Cockpit Display |  | X | — | — | — | — | OFF | OFF |
|  | X |  | — | — | X |  | ON | ON |
| Alternative 2 | X |  |  | X |  | X | ON | OFF |
|  | X |  |  | X | X |  | OFF | OFF |

Figure 1:
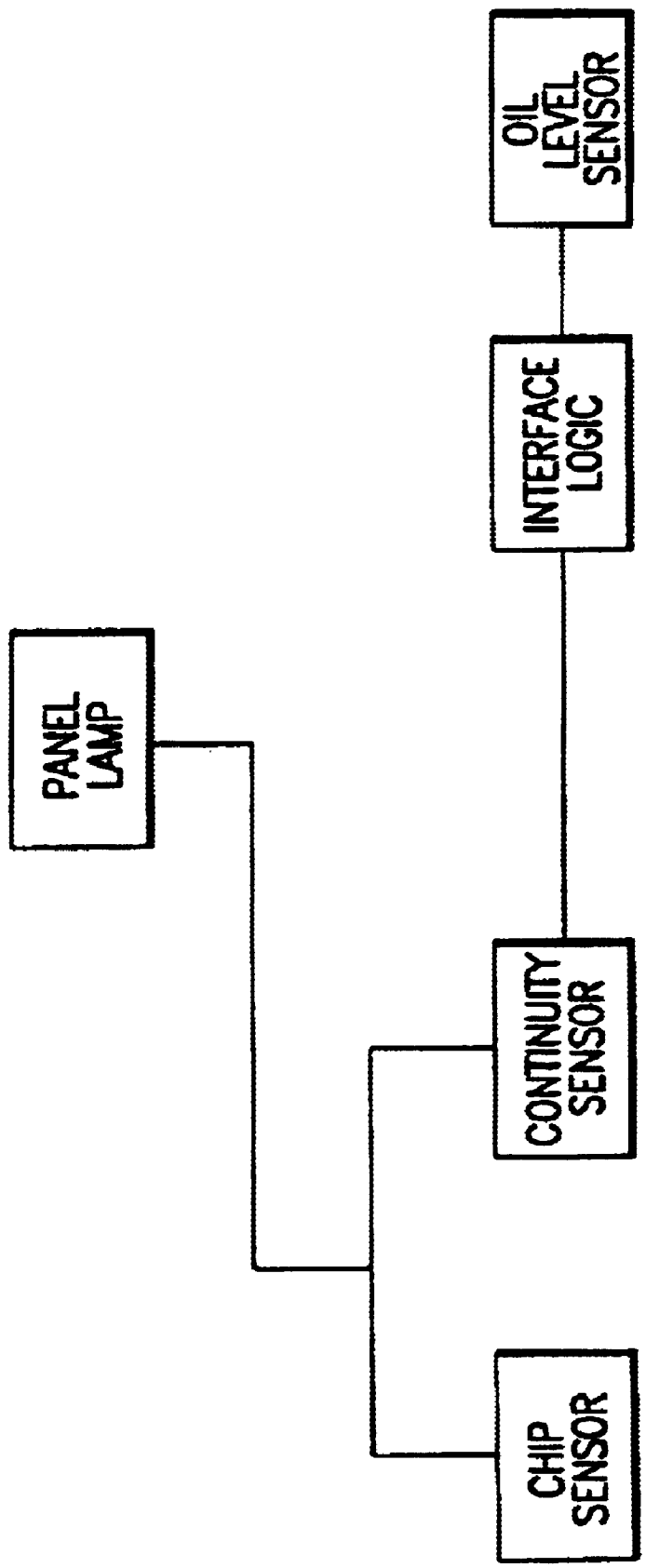
FIG. 1 is a block diagram showing the functional interrelationship of the components.

A primary purpose of the present invention to test two or more functions utilizing a single direct current circuit and its associated indicator. The technique utilized is to place interface logic elements between the sensor(s) and the continuity testing circuit to modulate the behavior of the continuity testing circuit. For this patent document, the ability to test for multiple functions over a single direct current connection is exemplified by the addition of appropriate interface logic elements in the circuit connecting the continuity testing circuit with the oil level sensing circuit. The functional arrangement is shown in FIG. 1. Both the chip sensor and the continuity testing circuit can independently cause the illumination of the panel lamp as indicated by the parallel lines connecting the lamp to the chip sensor and continuity testing circuit. The oil level sensor is interfaced to the continuity testing circuit by the interface logic and can modulate the behavior of the continuity testing circuit. The multifunction tester will be described by first describing the function of the continuity testing circuit, then the functioning of the oil level sensor, and finally, the functioning of the continuity testing circuit and oil level sensor with the interface logic. The continuity testing circuit used by way of example is that described in co-pending U.S. patent application Ser. No. 09/911,941. It should be understood that other continuity testing circuits could be employed in the present invention provided that they also provide a high bit output at the conclusion of the continuity testing period.

Figure 2:
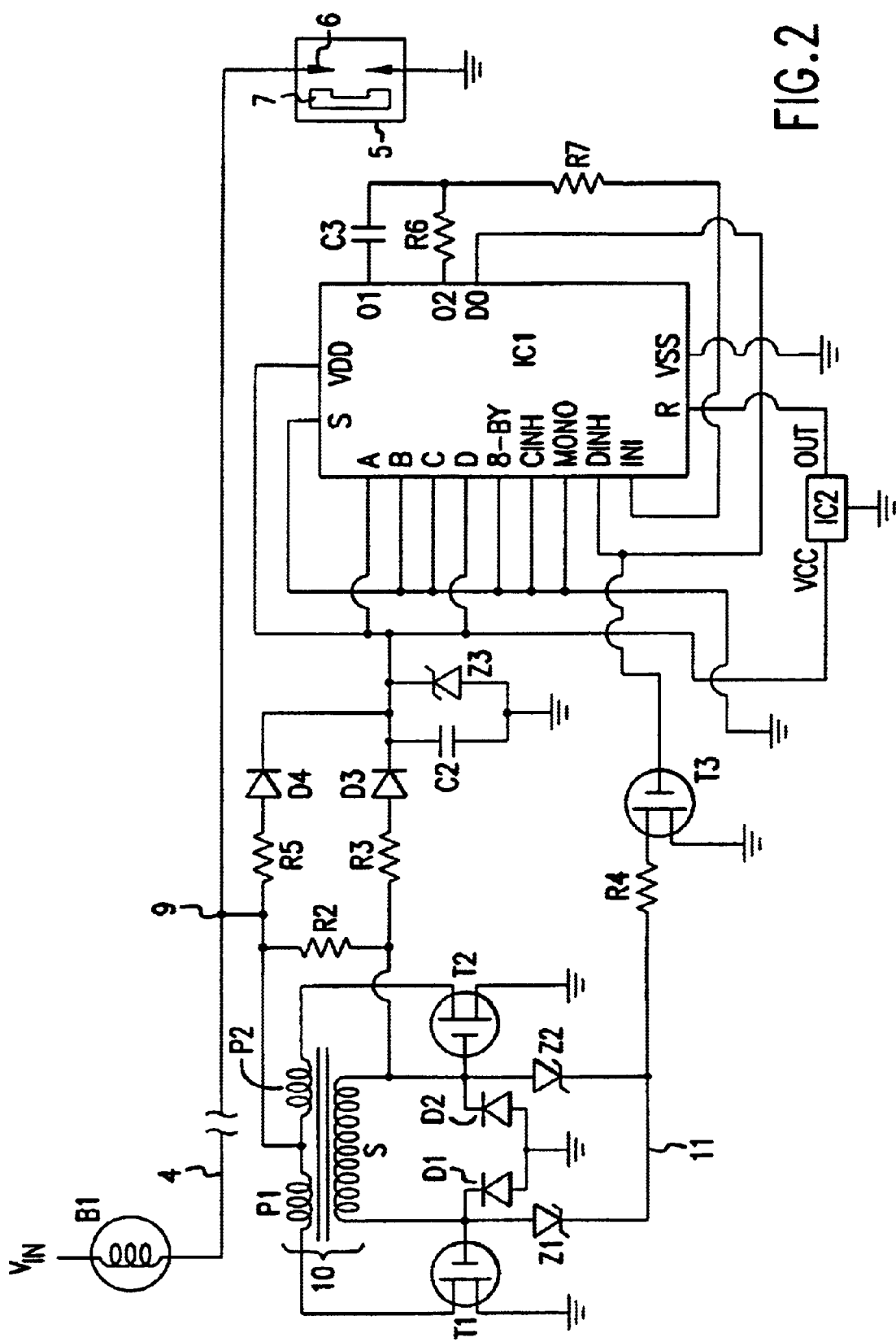
FIG. 2 is a schematic diagram of a continuity testing circuit.

As shown in FIG. 2, an indicator lamp B1 is connected in an electrical series circuit through conductor 4 to one side of chip sensor 5 located in the lubricating oil of an engine or power train (not shown) or a hydraulic system. Sensor 5 contains a magnet 7 which draws metallic chips to contacts 6. One plate of sensor 5 is connected to conductor 4 while the other plate is connected to ground. A direct current voltage source $V_{IN}$ is connected to one side of lamp B1.

The continuity testing circuit/switch is electrically connected to conductor 4 at point 9 located in close physical proximity to sensor 5. The circuit/switch has a step up transformer 10 with two primary coils P1 and P2, and a secondary coil S. Each primary coil has M turns and the secondary has N turns. Primary coil P1 is connected to the drain of MOS-FET transistor T1 and primary coil P2 is connected to the drain of MOS-FET transistor T2. The sources of transistors T1 and T2 are connected to ground. The two ends of the secondary coil are connected to the gates of T1 and T2. Bias resistor R2 connects conductor 4 directly to the gate of transistor T2 and the gate of T1 through the secondary winding S. Diodes D1 and D2 are connected to the gates of T1 and T2 and the common anodes are connected to ground. Zener diode Z1 is connected to the gate of T1 and zener diode Z2 is connected to the gate of T2. The two Zener diode cathodes are common and connected to line 11 which is in series with resistor R4 to the drain of MOS-FET transistor T3. The source of transistor T3 is connected to ground. The gate of transistor T3 is connected to the output DO of timer IC1, a multi-stage binary counter.

A current limiting resistor R3 connects bias resistor R2 through diode D3 to the power input of timer IC1, capacitor C2, zener diode Z3, and the power input of voltage monitor IC2. Another current limiting resistor R5 is connected through diode D4 to the power input of timer IC1, capacitor C2, zener diode Z3, and the power input of voltage monitor IC2. The other side of capacitor C2 and zener diode D3 are connected to ground as are the ground terminals of IC1 and IC2. The output of voltage monitor IC2 is connected to the reset input of timer IC1. Timer IC1 has several selection leads which may be either open or shorted to ground to select the time duration. The internal clock frequency of IC1 is determined by the values of capacitor C3, and resistors R6 and R7.

The operation of the monitoring circuit of the invention will now be described assuming that the continuity testing switch/circuit starting at point 9 is not connected. Conductor 4 is not grounded provided that metallic chips do not bridge the contacts 6 in sensor 5. Upon application of power, $V_{IN}$ is applied to one side of lamp B1. Since there is no complete circuit to ground, no current flows and the lamp is not illuminated. If metallic chips are present across the contacts 6 of sensor 5, conductor 4 is connected by sensor 5 to ground. In this case current flows through lamp B1 and the lamp will stay on continuously. However, if the conductor to the sensor is open, closure across the contacts of sensor 5 will never turn on the lamp.

To test continuity of the conductor leading to the sensors, the operation of the continuity testing switch/circuit will now be described assuming that the continuity testing switch/circuit is connected at point 9. Initially, it should be recognized that if metallic chips bridge the gap between the contacts 6 in sensor 5, the monitoring circuit will behave as previously indicated and the presence of the continuity testing switch/circuit will have no effect. If metallic chips complete the circuit in sensor 5, conductor 4 will be at essentially zero voltage, no effective voltage will be applied to activate the continuity testing switch/circuit. Thus, even in the presence of the continuity testing switch/circuit, the panel lamp will illuminate continuously to indicate the presence of metallic chips in the oil. However, if no chips are present across contacts 6, the continuity testing switch/circuit operates as follows.

Transformer 10, transistors T1 and T2, diodes D1 and D2, zener diodes Z1 and Z2, and bias resistor R2 comprise a self-powered a stable low power oscillator. Upon power-up (the application of $V_{IN}$ to the circuit), the voltage rises on conductor 4 and is applied to the dual primary windings P1 and P2 of transformer 10 and through them to the drain of MOSFET transistors T1 and T2. Simultaneously voltage is applied to the gate of transistor T2 through bias resistor R2. Initially the low power oscillator is off until the voltage on conductor 4 reaches several volts when the voltage provided by bias resistor R2 becomes sufficient to turn on transistor T2. Transistor T2 then draws current through primary winding P2 directly to ground. At this point, the low power oscillator starts up and runs generating a substantially sinusoidal periodic waveform of approximately 75 KHz. The voltage of the wave form is a function of the turns ratio N/M of the transformer primary and secondary coils. In a preferred embodiment M is 2 and N is 200 yielding a 100:1 voltage step up. Typically the peak to peak voltage will be several volts. Diodes D1 and D2 provide a return path for the drive current from the alternating waveform out of the transformer secondary S into transistor switches T1 and T2. Depending on the resistance characteristics of lamp B1 a current sufficient to burn out transistors T1 and T2 may flow through the oscillator circuit to ground. Zener diodes Z1 and Z2 provide over-voltage burn out protection to switch transistors T1 and T2. As will be seen, loading resistor R4 and switch transistor T3 are used to turn off the low power oscillator.

When configured as set forth above, the oscillator circuit has the unique characteristic of operating with a very small voltage drop across the primary windings P1 and P2 from conductor 4 at point 9 to ground. The oscillator appears as essentially a short circuit between conductor 4 and ground permitting current to flow through conductor 4. While the oscillator runs, the lamp is therefore turned on indicating that there is continuity in the sensor conductor circuit up to point 9.

As indicated above, it is necessary to turn the lamp in the cockpit off after a predetermined continuity testing period. Timing and turning off of the lamp is accomplished as follows using IC1.

Power is supplied to IC1 both through bias resistor R2 and diode D3, resistor R5 and diode D4, and through the alternating waveform output of the oscillator through resistor R3 and diode D3. The alternating oscillator output is rectified by diode D3 and applied along with power from resistor R5 and diode D4 to the power input of IC1, the power input of voltage monitor IC2, capacitor C2, and zener diode Z3. The input voltage to IC1 and IC2 is regulated by zener diode Z3 and capacitor C2. Capacitor C2 is slowly charged up and provides even power to IC1. Voltage monitor IC2 is used to generate a "clear reset" signal into counter IC1 during power up until IC1 is ready to count clock pulses and begin the timing cycle. When the voltage across capacitor C2 increases above 3.5 volts, the reset signal from IC2 ends which allows counter IC1 to begin counting clock pulses and begin the timing cycle. The clock pulses are counted until a predetermined value set by the select lines is reached. When the timed value is reached, the output of IC1 goes high. The high bit signal applied to the gate of transistor T3 connects the gates of transistors T1 and T2 to ground through resistor R4 and zener diodes Z1 and Z2 thereby turning off the oscillator. Once the oscillator is turned off, it no longer acts like a short to ground of conductor 4 and no current flows through lamp B1. The output of IC1 stays high as long as the power $V_{IN}$ is supplied to the system. Thus the continuity testing switch/circuit stays deactivated until the aircraft system is powered down and up again. In this manner, power supplied in the sensor circuit powers the continuity testing cycle, the continuity of conductor 4 to sensor 5 is checked each time the system is powered up, and the system is returned to a state where only a short across contacts 6 in the sensor will activate the panel lamp. The lamp illumination circuit may consist of a lamp bulb, a logic circuit, a voltage comparator, or some other responsive circuit.

Figure 3:
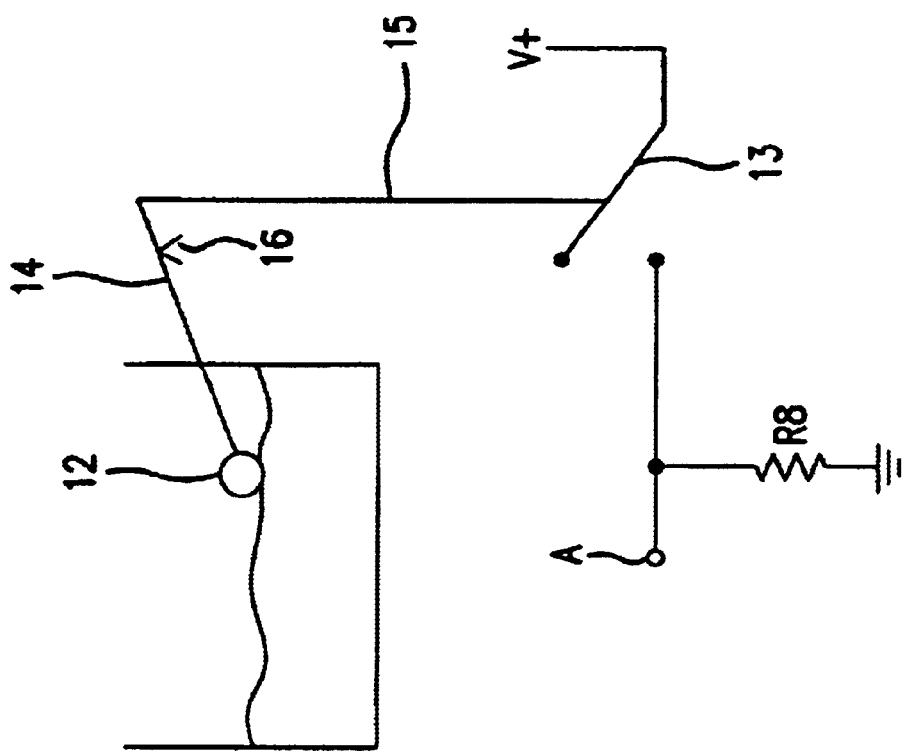
FIG. 3 shows a schematic diagram of a generic float switch connected to an electrical switch.

FIG. 3 shows a simple oil level sensor consisting of a float 12 attached through lever arm 14 and linkage 15 to an electrical switch 13. Arm 14 pivots about fulcrum 16. The motion of the float opens or closes switch 13. For purposes of the present description, the float will be considered to close the switch when oil is present. One side of the switch is connected to a power source V+. The other side of the switch is connected through a current limiting resistor R8 to ground. Closure of the switch will cause a voltage to appear at point A. This voltage will be referred to as a high bit. Clearly other types of oil level sensors may be employed. If the output of such other sensors is not a high bit, those skilled in the art are familiar with standard methods to convert any output to a high bit. In the present embodiment of the multifunction tester, the side of the switch connected to a power source V+ is connected to the power input to IC1 of the continuity testing switch/circuit.

Figure 4:
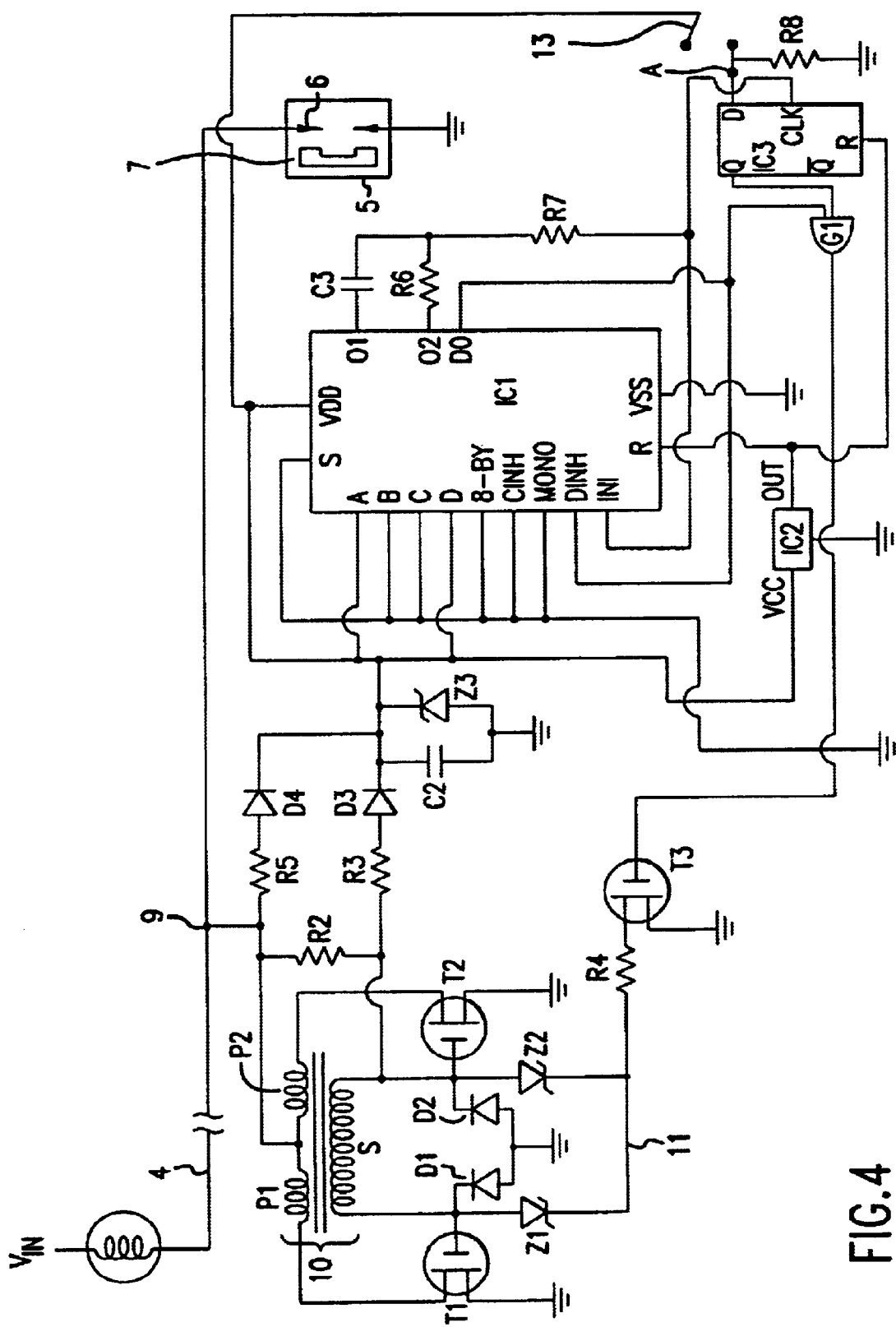
FIG. 4 is a schematic diagram of the first embodiment of the invention which provides for a display in the first manner pilots are trained to recognize.

FIG. 4 shows the continuity testing switch/circuit, the oil level sensor, and the logic elements integrated into a first embodiment of the multifunction tester. This embodiment provides for the first display manner for the pilots discussed above. IC3 is a standard dual D-type flip flop. Logic element G1 is a standard "AND" gate. The clock signal from IC1 is applied to the clock input CLK of IC3. The output of IC2 is applied to the reset input R of IC3. The non-powered side of oil level switch 13 is connected to the data input D of IC3. The non-inverted output Q of IC3 is connected to one input of logic gate G1. The counter output of IC1 is no longer connected to the gate of transistor T3 but is now connected to the second input of logic gate G1. The output of logic gate G1 is connected to the gate of transistor T3. Logic gate G1 and flip-flop IC3 are powered from the power input to IC1.

The operation of the multifunction circuit will now be described. Upon aircraft power-up $V_{IN}$ is applied to the continuity testing switch circuit as described above. Voltage monitor IC2 provides a reset signal to both IC1 and IC3 at which time IC3 is activated. IC3 will continue to function as long as the clock signal is applied to its clock CLK input. If there is oil present at float 12, switch 13 will be closed and a high bit will be present at the data input D of IC3. As a result of the high bit at D a high bit will be output from IC3 at Q. During the timed period of IC1, the output of IC1 at DO will be a low bit. Thus, during the timed period of IC1, logic gate G1 will see as input one low bit from IC1 and one high bit from IC3. "Anding" the two bits, gate G1 will provide a low bit out to the gate of transistor T3 and T3 will not ground transistors T1 and T2 shutting down the oscillator. The oscillator will continue to run and illuminate the panel lamp during the continuity testing period. At the end of the continuity testing period, the output of IC1 at DO goes high. Logic gate G1 will see as input a high bit from IC1 and a high bit from IC3. "Anding" the two high bits, gate G1 provides a high bit out to the gate of transistor T3 thereby turning off the oscillator. Since the output of IC1 at DO is connected to the clock inhibit OINH input of IC1, as the output goes high, the internal clock is turned off and no longer provides a signal to the clock input CLK of IC3. IC3 will not change the Q output until reset thereby effectively latching the input at D. Subsequent vibration of the aircraft, which might change the status of the oil level sensor, can not effect the panel indicator. For instance, if the status was not latched, vibration might cause the oil level switch to open, the input to G1 from Q of IC3 would go low and the output gate of G1 would turn off T3 thereby turning the oscillator on again. Thus, in the presence of oil, the multifunction circuit illuminates the panel lamp during the continuity test cycle and turns the panel lamp off after the continuity test cycle in accordance with the first manner the pilots expect.

If there is no oil present at the oil sensor float 12 at aircraft power-up, the oil sensor switch 13 will be open and a high bit will not be present at A or the data input D of IC3. After the reset signal is supplied by IC2, a low bit will be present at the Q output of IC3 and one input of logic gate G1. As before, IC1 will provide a low bit out at DO during the continuity timing cycle. Logic gate G1 will see a low bit from IC1 and a low bit from IC3 and will provide a low bit out to the gate of transistor T3 which will not turn off the oscillator. At the end of the continuity testing time period, DO will go high again turning off the clock and latching the value of D at IC3. "Anding" the high bit from IC1 and the low bit from IC3, gate G1 will continue to provide a low bit out to the gate of transistor T3 which will not turn off the oscillator. Thus, in the absence of oil at the oil sensor, the panel lamp will illuminate during the continuity testing period and stay illuminated after the continuity testing period indicating a fault in accordance with the first manner the pilots expect.

Figure 5:
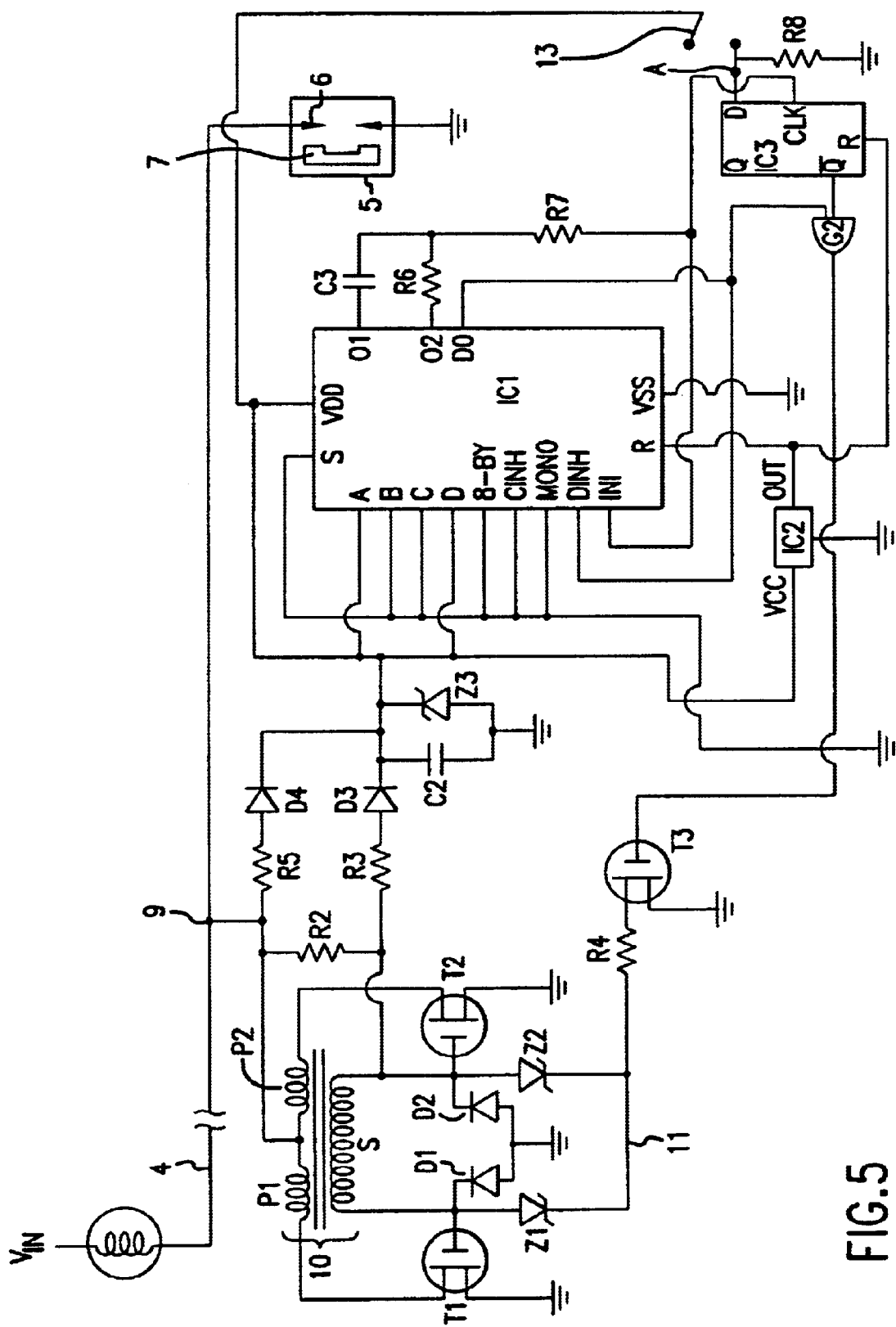
FIG. 5 is a schematic diagram of the second embodiment of the invention which provides for a display in the second manner pilots are trained to recognize.

FIG. 5 shows the continuity testing switch/circuit, the oil level sensor, and logic elements integrated into another embodiment of the multifunction tester. This embodiment provides for the second display manner for the pilots discussed above. IC3 is the same flip flop and is integrated in the circuit in the same manner as described above except that the inverting output Q is used. Logic gate G2 is a standard "OR" gate. One input of G2 is connected to the Q output of IC3 while the other input of G2 is connected to the DO timer output of IC1. The output of logic gate G2 is connected to the gate of transistor T3.

The operation of the multifunction circuit will now be described. Upon aircraft power-up $V_{IN}$ is applied to the continuity testing switch circuit as described above. Voltage monitor IC2 provides a reset signal to both IC1 and IC3 at which time IC3 is activated. IC3 will continue to function as long as the clock signal is applied to its clock CLK input. If there is oil present at float 12, switch 13 will be closed and a high bit will be present at the data input D of IC3. As a result of the high bit at D a low bit will be output from IC3 at Q. During the timed period of IC1, the output of IC1 at DO will be a low bit. Thus, during the timed period of IC1, logic gate G2 will see as input one low bit from IC1 and one low bit from IC3. "Oring" the two bits, since neither input is high, gate G2 will provide a low bit out to the gate of transistor T3 and T3 will not ground transistors T1 and T2 shutting down the oscillator. The oscillator will continue to run and illuminate the panel lamp during the continuity testing period. At the end of the continuity testing period, the output of IC1 at DO goes high. Logic gate G2 will see as input a high bit from IC1 and a low bit from IC3. Since one of the two input bits is high, "Oring" the two bits, gate G2 provides a high bit out to the gate of transistor T3 thereby turning off the oscillator. Since the output of IC1 at DO is connected to the clock inhibit OINH input of IC1, as the output goes high, the internal clock is turned off and no longer provides a signal to the clock input CLK of IC3. IC3 will not change the Q output until reset thereby effectively latching the input at D. Subsequent vibration of the aircraft which might change the status of the oil level sensor can not effect the panel indicator. Thus, in the presence of oil, the multifunction circuit illuminates the panel lamp during the continuity test cycle and turns the panel lamp off after the continuity test cycle in accordance with the second manner the pilots expect.

If there is no oil present at the oil sensor float 12 at aircraft power-up, the oil sensor switch 13 will be open and a low bit will be present at A or the data input D of IC3. After the reset signal is supplied by IC2, a high bit will be present at the Q output of IC3 and one input of logic gate G2. As before, IC1 will provide a low bit out at DO during the continuity timing cycle. Logic gate G2 will see a low bit from IC1 and a high bit from IC3. Since one of the two inputs is high, "oring" the inputs, logic gate G2 will provide a high bit out to the gate of transistor T3 which will turn off the oscillator. Thus, the panel lamp will not illuminate. The fact that the continuity testing timer in IC1 continues to operate until the end of its timed cycle does not affect the panel display. The oil sensor has effectively shut down the oscillator so that no current will be drawn through the panel lamp. However, at the end of the continuity testing time period, DO will go high again turning off the oscillator and latching the value of D at IC3. Thus, in the absence of oil at the oil sensor, the panel lamp will not illuminate during the continuity testing period and will remain off after the continuity testing period indicating a fault in accordance with the second manner the pilots expect.

Figure 6:
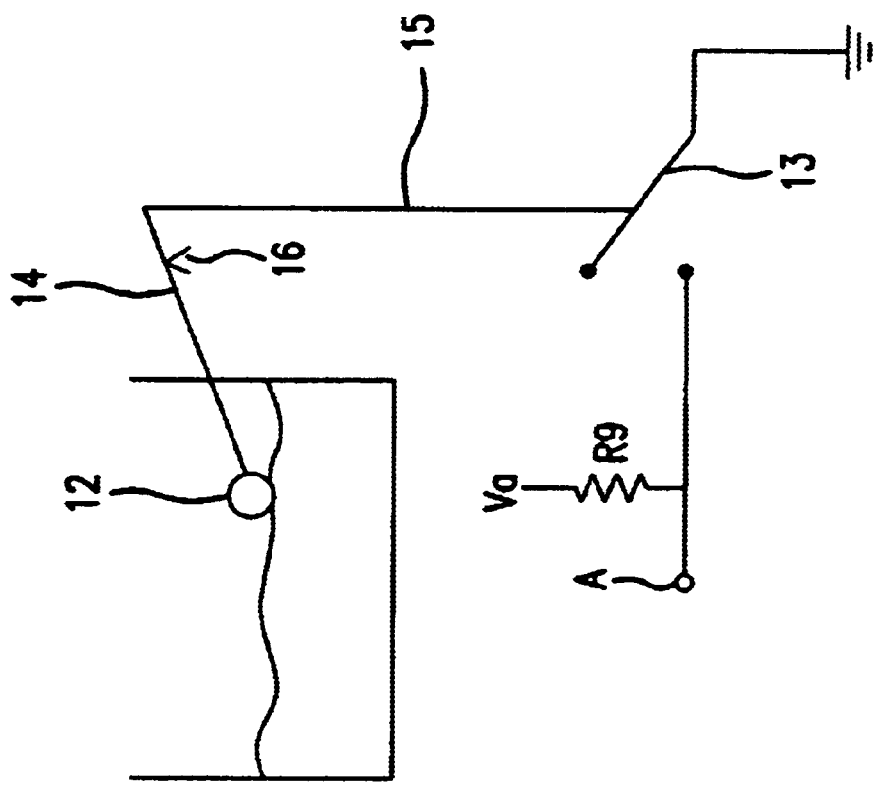
FIG. 6 shows a schematic diagram of a generic float switch connected to an electrical switch in an alternative manner to that shown in FIG. 3.
Figure 7:
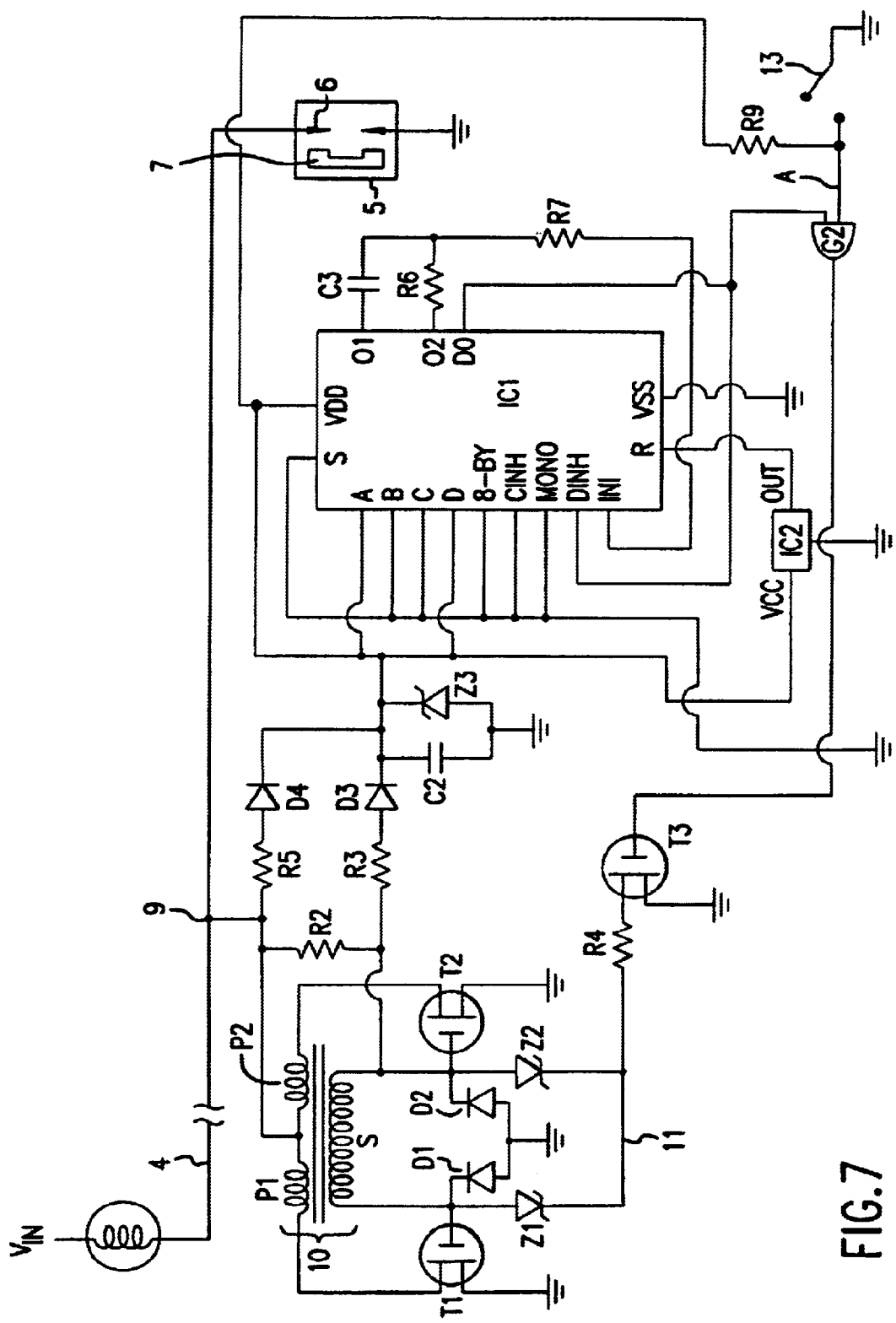
FIG. 7 is a schematic diagram of an alternative second embodiment of the invention which provides for a display in the second manner pilots are trained to recognize.

An additional embodiment which provides for the second manner which pilots expect to see is shown in FIG. 6 and FIG. 7. FIG. 6 shows the float switch connected to the electrical switch in the same manner as earlier. Now, however, one side of the switch is grounded while the other side of the switch is connected through resistor R9 to a voltage source. FIG. 7 shows the switch integrated into the continuity testing circuit. Logic gate G2 is a standard "OR" gate. One input of G2 is connected to one side of the oil level switch 13 and to resistor R9. Resistor R9 is connected to the power input of IC1. The other input of G2 is connected to the DO timer output of IC1. The output of logic gate G2 is connected to the gate of transistor T3.

The operation of the multifunction circuit will now be described. Upon aircraft power-up $V_{IN}$ is applied to the continuity testing switch circuit as described above. Voltage monitor IC2 provides a reset signal to IC1. If there is oil present at float 12, switch 13 will be closed. The entire voltage will drop over resistor R9 and the switch will provide a low bit out to one input of gate G2. During the timed period of IC1, the output of IC1 at DO will be a low bit. Thus, during the timed period of IC1, logic gate G2 will see as input one low bit from IC1 and one low bit from switch 13. "Oring" the two bits, since neither input is high, gate G2 will provide a low bit out to the gate of transistor T3, and T3 will not ground transistors T1 and T2 shutting down the oscillator. The oscillator will continue to run and illuminate the panel lamp during the continuity testing period. At the end of the continuity testing period, the output of IC1 at DO goes high. Logic gate G2 will see as input a high bit from IC1 and a low bit from switch 13. Since one of the two input bits is high, "Oring" the two bits, gate G2 provides a high bit out to the gate of transistor T3 thereby turning off the oscillator. Subsequent vibration of the aircraft, which might change the status of the oil level sensor and cause switch 13 to open, can not effect the panel indicator since an open switch would just provide another high input to gate G2 which already sees a high input from IC1. Thus, in the presence of oil, the multifunction circuit illuminates the panel lamp during the continuity test cycle and turns the panel lamp off after the continuity test cycle in accordance with the second manner the pilots expect.

If there is no oil present at the oil sensor float 12 at aircraft power-up, the oil sensor switch 13 will be open and a high bit will be present at A and one input of logic gate G2. As before, IC1 will provide a low bit out at DO during the continuity timing cycle. Logic gate G2 will see a low bit from IC1 and a high bit from switch 13. Since one of the two inputs is high, "oring" the inputs, logic gate G2 will provide a high bit out to the gate of transistor T3 which will turn off the oscillator. Thus, the panel lamp will not illuminate. The fact that the continuity testing timer in IC1 continues to operate until the end of its timed cycle does not affect the panel display. The oil sensor has effectively shut down the oscillator so that no current will be drawn through the panel lamp. However, at the end of the continuity testing time period, DO will go high again turning off the clock and causing the other input of G2 to be high. Gate G2 will continue to provide a high bit out to the gate of transistor T3 thereby keeping the oscillator turned off. Even if aircraft vibration should cause a change in the status of switch 13 after the timed period so that it provides a low bit, the oscillator will not be turned back on due to the high bit from IC1. Thus, in the absence of oil at the oil sensor, the panel lamp will not illuminate during the continuity testing period and will remain off after the continuity testing period indicating a fault in accordance with the second manner the pilots expect.

As indicated above, other continuity testing circuits and other oil sensors may be employed. Those skilled in the art will appreciate that the outputs of each can be modified by standard means and integrated with appropriate logic to accomplish the functions of the multifunction sensor of the present invention. All such modifications to achieve a multifunction sensor are considered within the teaching of the present patent document and the claims.

What is claimed is:

1. A multifunction direct current monitoring circuit having a single conductor and ground for an aircraft, which indicates an adverse condition detected by at least one or more sensors connected to the circuit, by a single indicator located in the aircraft cockpit:

a) a first sensor connected to the conductor and ground;
b) a continuity testing circuit having a conducting and non-conducting state connected electrically in parallel with the first sensor;
c) at least one additional sensor; and
d) means responsive to the at least one additional sensor for causing the continuity testing circuit to remain in a conducting or a non-conducting state depending on the status of the additional sensor.

2. The circuit of claim 1 in which the first sensor comprises a chip detector.

3. The circuit of claim 2 in which the continuity testing circuit comprises:
a) a self-powered a stable oscillator; and
b) a timer
wherein the oscillator and timer are activated by application of power to the conductor, the oscillator permitting current to flow between the conductor and ground until the timer output, upon reaching a predetermined setting, deactivates the oscillator.

4. The circuit of claim 3 in which the at least one additional sensor comprises an oil level sensor.

5. The circuit of claim 4 in which the responsive means comprises interface logic connecting the at least one additional sensor to the continuity testing circuit.

6. The circuit of claim 2 in which the at least one additional sensor comprises an oil level sensor.

7. The circuit of claim 6 in which the responsive means comprises interface logic connecting the at least one additional sensor to the continuity testing circuit.

8. The circuit of claim 1 in which the continuity testing circuit comprises:
a) a self-powered astable oscillator; and
b) a timer
wherein the oscillator and timer are activated by application of power to the conductor, the oscillator permitting current to flow between the conductor and ground until the timer output, upon reaching a predetermined setting, deactivates the oscillator.

9. The circuit of claim 1 in which the at least one additional sensor comprises an oil level sensor.

10. The circuit of claim 1 in which the responsive means comprises interface logic.

11. A method of indicating in an aircraft using a direct current monitoring circuit having a single conductor, ground, and indicator an adverse condition detected by at least one or more sensors connected to the circuit comprising:
a) connecting a first sensor to the conductor and ground;
b) connecting a continuity testing circuit having a conducting and a non-conducting state electrically in parallel to the first sensor;
c) providing at least one additional sensor; and
d) modifying the conducting or non-conducting status of the continuity testing circuit in accordance with the status of the at least one additional sensor.

12. The method of claim 11 in which the first sensor comprises a chip detector.

13. The method of claim 12 in which the continuity testing circuit comprises:
a) a self-powered a stable oscillator; and
b) a timer
wherein the oscillator and timer are activated by application of power to the conductor, the oscillator permitting current to flow between the conductor and ground until the timer output, upon reaching a predetermined setting, deactivates the oscillator.

14. The method of claim 13 in which the at least one additional sensor comprises an oil level sensor.

15. The method of claim 14 in which the conducting or non-conducting status of the continuity testing circuit is modified in accordance with the status of the at least one additional sensor by interface logic means connecting the at least one additional sensor to the continuity testing circuit.

16. The method of claim 12 in which the at least one additional sensor comprises an oil level sensor.

17. The method of claim 16 in which the conducting or non-conducting status of the continuity testing circuit is modified in accordance with the status of the at least one additional sensor by interface logic means connecting the at least one additional sensor to the continuity testing circuit.

18. The method of claim 11 in which the continuity testing circuit comprises:

a) a self-powered a stable oscillator; and b) a timer wherein the oscillator and timer are activated by application of power to the conductor, the oscillator permitting current to flow between the conductor and ground until the timer output, upon reaching a predetermined setting, deactivates the oscillator.

19. The method of claim 11 in which the at least one additional sensor comprises an oil level sensor.

20. The method of claim 11 in which the conducting or non-conducting status of the continuity testing circuit is modified in accordance with the status of the at least one additional sensor by interface logic means connecting the at least one additional sensor to the continuity testing circuit.

21. A multifunction direct current monitoring circuit comprising:

a) an electrically operated panel indicator;

b) first sensor means for activating the panel indicator to indicate the presence of metallic chips in a lubricating fluid;

c) means for checking the continuity of electrical conductors leading from the panel indicator to the sensor means for activating the panel indicator to indicate the presence of metallic chips;

d) second sensor means for detecting the presence of lubricating fluid at said first sensor means for activating the panel indicator to indicate the presence of metallic chips; and e) means for causing the means for checking the continuity of electrical conductors to remain in a conducting or a non-conducting state depending on the status of the second sensor means for detecting the presence of lubricating fluid.

* * * * *